United States Patent
Werthmann (10) Patent No.: US 9,548,293 B2
(45) Date of Patent: Jan. 17, 2017

(54) III-NITRIDE BASED ESD PROTECTION DEVICE

(71) Applicant: Infineon Technologies AG, Neubiberg (DE)

(72) Inventor: Hubert Werthmann, Munich (DE)

(73) Assignee: Infineon Technologies AG, Neubiberg (DE)

(*) Notice: Subject to any disclaimer, the term of this patent is extended or adjusted under 35 U.S.C. 154(b) by 13 days.

(21) Appl. No.: 14/180,980

(22) Filed: Feb. 14, 2014

(65) Prior Publication Data
US 2015/0236008 A1  Aug. 20, 2015

(51) Int. Cl.
| H01L 23/62 | (2006.01) |
| H01L 27/02 | (2006.01) |
| H01L 29/66 | (2006.01) |
| H01L 29/868 | (2006.01) |
| H01L 29/20 | (2006.01) |

(52) U.S. Cl.
CPC ..... *H01L 27/0255* (2013.01); *H01L 29/66204* (2013.01); *H01L 29/868* (2013.01); *H01L 29/2003* (2013.01)

(58) Field of Classification Search
CPC .. H01L 27/0266; H01L 23/62; H01L 27/0248; H01L 27/0255
USPC .................................................. 257/355, 360
See application file for complete search history.

(56) References Cited

U.S. PATENT DOCUMENTS

| 7,557,672 | B1* | 7/2009 | Adam et al. ................. 333/17.2 |
| 8,502,258 | B2* | 8/2013 | O'Keefe ........... H01L 21/02381 257/79 |
| 8,928,388 | B2* | 1/2015 | Lu et al. ....................... 327/312 |
| 2005/0190514 | A1 | 9/2005 | Walters |
| 2013/0161633 | A1 | 6/2013 | Nie et al. |
| 2014/0203367 | A1* | 7/2014 | Chen et al. ................... 257/355 |

FOREIGN PATENT DOCUMENTS

WO      2009043364 A1     4/2009

OTHER PUBLICATIONS

Unknown, Author, "ESD Protection for USB 3.0 (SuperSpeed USB) Ports." Application Note RCP0104E, Jul. 2011, pp. 1-5, Tyco Electronics Corporaton.
Unknown, Author, "What are TVD Diodes?" TVS Diode Application Note SI96-01, Revision Sep. 2000, pp. 1-1, Semtech Corporation.

* cited by examiner

*Primary Examiner* — Tan N Tran
(74) *Attorney, Agent, or Firm* — Murphy, Bilak & Homiller, PLLC (57) ABSTRACT

An ESD (electrostatic discharge) protection device includes a first III-nitride p-i-n diode and a second III-nitride p-i-n diode connected to the first III-nitride p-i-n diode in an antiparallel arrangement configured to provide voltage clamping at 5V or less under forward bias of either the first or second III-nitride p-i-n diode for transient current in both forward and reverse directions. A corresponding method of manufacturing the ESD protection device is also provided.

20 Claims, 8 Drawing Sheets

Figure 6

III-NITRIDE BASED ESD PROTECTION DEVICE

TECHNICAL FIELD

The present application relates to electrostatic discharge (ESD) protection, and in particular ESD protection for electronic circuits having low use voltages.

BACKGROUND

The use voltages of modern electronic components tend to be decreasing. For example, new data transfer systems such as those compatible with USB (universal serial bus) version 3.0 require a maximum use voltage of 2V. At the same time, higher operating frequencies are being used by modern electronic components. A suitable ESD (electrostatic discharge protection) protection device for such a low voltage class of higher operating frequency electronic components must have a relatively low trigger voltage e.g. of about 3.5V. That is, the ESD protection device must clamp the use voltage of the electronic component at a relatively low level such as about 3.5V to protect the electronic component from overvoltage conditions.

ESD protection is conventionally provided for electronic components in a low voltage class such as USB version 3.0 compliant devices by connecting a TVS (transient voltage suppression) diode in serial with a low capacitance p-i-n diode. A p-i-n diode is a diode with a wide, intrinsic semiconductor zone between a p-type semiconductor zone and an n-type semiconductor zone. The p-type and n-type regions are typically heavily doped for use as ohmic contacts. A large TVS diode in serial with a p-i-n diode absorbs the energy of an ESD event. TVS diodes are solid state pn junction devices designed to protect sensitive semiconductors from the damaging effects of transient voltages. The surge power and surge current capability of a TVS diode are proportional to the junction area of the diode. Under normal operating conditions, a TVS diode presents high impedance to the protected circuit. Ideally, the TVS diode appears as an open circuit, although leakage current is present. When the normal operating voltage of the protected circuit is exceeded e.g. due to an ESD event, the TVS diode junction avalanches under a breakdown condition and provides a low impedance path for the transient current. As a result, the transient current is diverted away from the protected components and shunted through the TVS diode.

TVS diodes are typically fabricated using inexpensive silicon. Silicon TVS diodes are unidirectional and have a lowest reasonable breakdown voltage of about 5V. The doping levels required to realize a breakdown voltage below 5V are very high, resulting in band-to-band tunneling to occur which causes high leakage currents in the range of several μA at even 2V. Such a breakdown response for a TVS diode is not acceptable for many applications such as mobile systems supplied by batteries. Thyristors can also be used for ESD protection. However, thyristors require a long reverse recovery time of more than 1 μs after an ESD event strike before the thyristor-based protection system can function again.

SUMMARY

According to an embodiment of an ESD (electrostatic discharge) protection device, the ESD protection device comprises a first III-nitride p-i-n diode and a second III-nitride p-i-n diode connected to the first III-nitride p-i-n diode in an antiparallel arrangement configured to provide voltage clamping at 5V or less under forward bias of either the first or second III-nitride p-i-n diode for transient current in both forward and reverse directions.

According to an embodiment of a method of manufacturing an ESD protection device, the method comprises: forming a first III-nitride p-i-n diode on a semiconductor substrate; forming a second III-nitride p-i-n diode on the semiconductor substrate; and connecting the second III-nitride p-i-n diode to the first III-nitride p-i-n diode in an antiparallel arrangement so as to provide voltage clamping at 5V or less under forward bias of either the first or second III-nitride p-i-n diode for transient current in both forward and reverse directions.

According to another embodiment of an ESD protection device, the ESD protection device comprises a first III-nitride p-i-n diode and a second III-nitride p-i-n diode connected to the first III-nitride p-i-n diode in an antiparallel arrangement. Each point of connection between the first and second III-nitride p-i-n diodes forms a terminal of the ESD protection device across which voltages are limited to 5V or less when either the first or second III-nitride p-i-n diode is under forward bias.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes

DETAILED DESCRIPTION

According to embodiments described herein, ESD protection is provided with sufficient leakage current suppression below 2.5V and with a trigger voltage of 5V or less. The III-nitride based ESD protection device described herein features low-ohmic behavior and low capacitance. The III-nitride based ESD protection device includes a pair of III-nitride p-i-n diodes connected in an antiparallel arrangement that provides voltage clamping at 5V or less under forward bias of either p-i-n diode for transient current in both forward and reverse directions.

Figure 1:
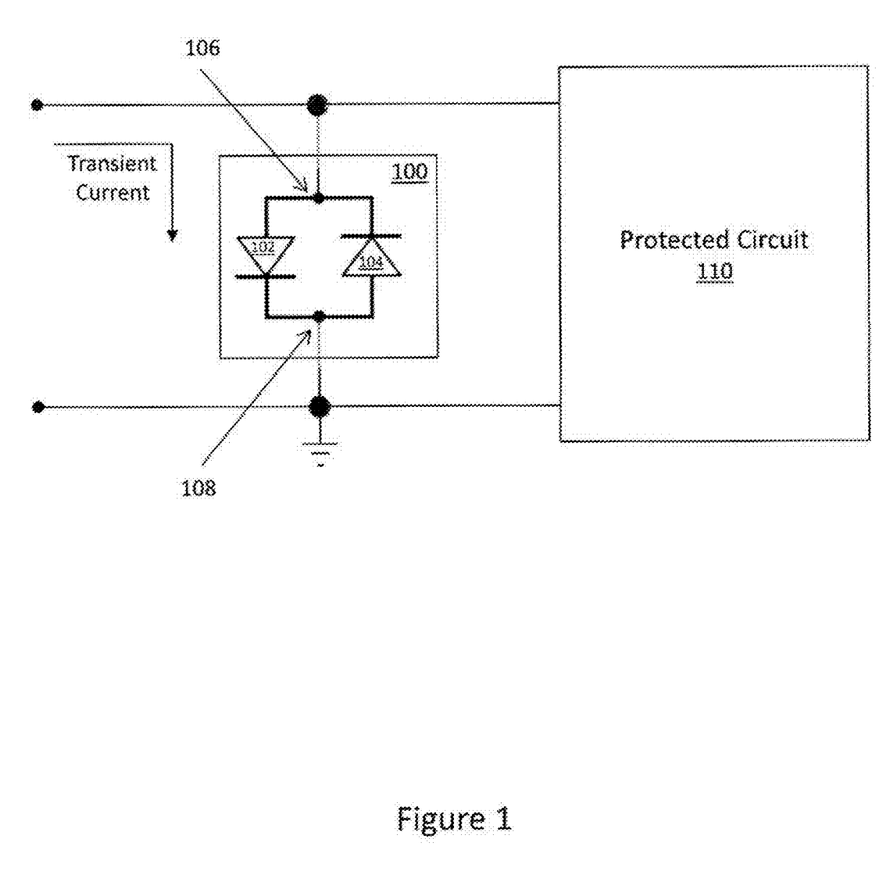
FIG. 1 illustrates a circuit diagram of an embodiment of a III-nitride based ESD protection device coupled in parallel with an electronic component.

FIG. 1 illustrates a schematic view of an embodiment of the III-nitride based ESD protection device 100 coupled in parallel with an electronic component 110 which can include a low voltage class device such as a USB version 3.0 compliant device. When the forward bias (trigger) voltage of the III-nitride based ESD protection device 100 is exceeded e.g. in response to an ESD event, the III-nitride based ESD protection device 100 provides a low impedance path for the transient current, diverting the transient current away from the protected circuit 110 and to ground.

Figure 2:
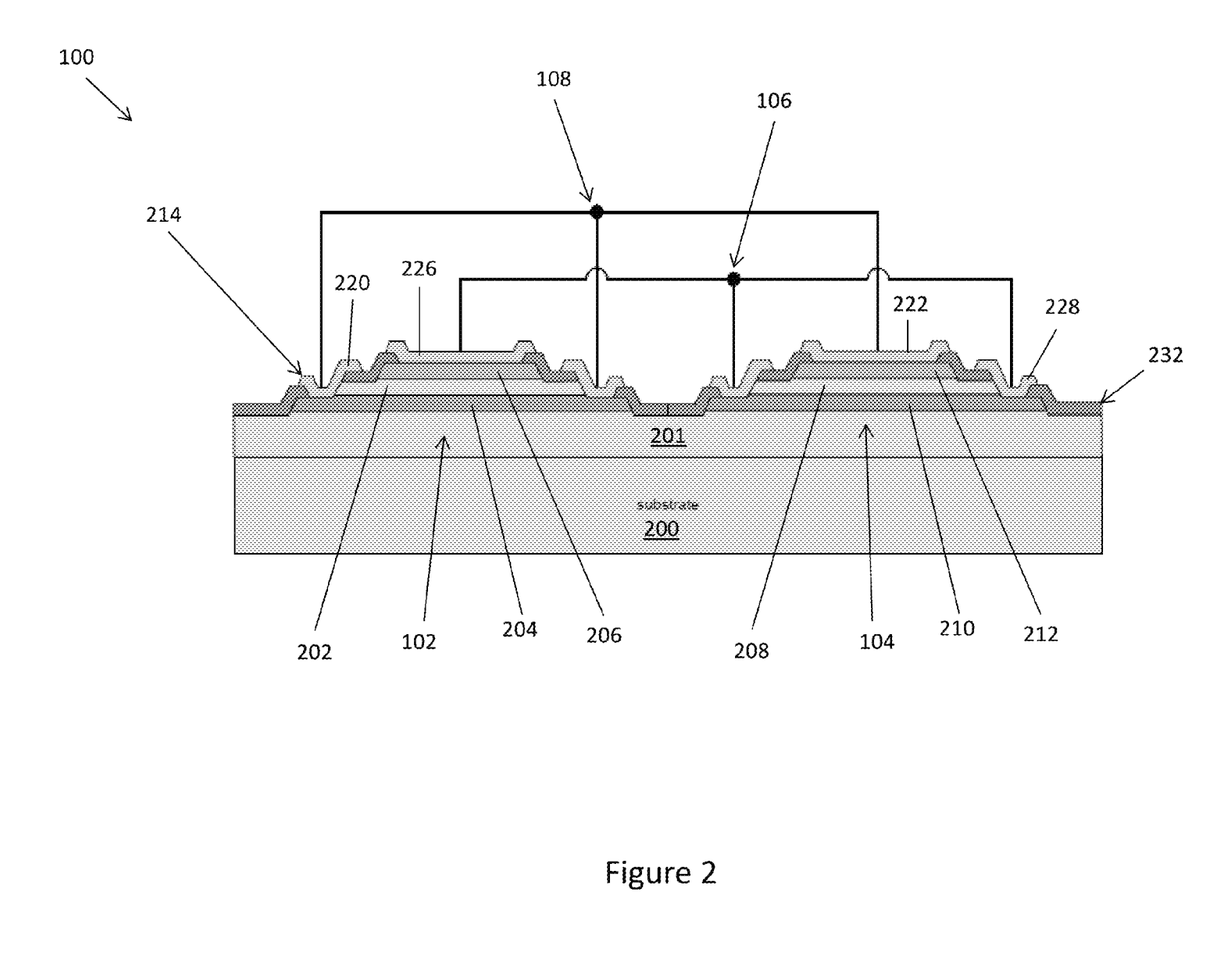
FIG. 2 illustrates a sectional view of an embodiment of a III-nitride based ESD protection device.

In more detail, the III-nitride based ESD protection device 100 includes a first III-nitride p-i-n diode 102 and a second III-nitride p-i-n diode 104 connected to the first III-nitride p-i-n diode 102 in an antiparallel arrangement. In electronics, two anti-parallel or inverse-parallel devices are connected in parallel but with their polarities reversed. The antiparallel arrangement of the III-nitride p-i-n diodes 102, 104 of the III-nitride based ESD protection device 100 allows for voltage clamping at 5V or less under forward bias of either p-i-n diode 102, 104 for transient current in both forward and reverse directions. That is one of the p-i-n diodes 102/104 is forward biased and provides voltage clamping at 5V or less for transient current in one direction, and the other p-i-n diode 104/102 is forward biased and provides voltage clamping at 5V or less for transient current in the opposite direction. Each point of connection between the III-nitride p-i-n diodes 102, 104 forms a terminal 106, 108 of the ESD protection device 100 across which voltages are limited to 5V or less when either III-nitride p-i-n diode 102, 104 is under forward bias. Such a configuration protects the electronic component 110 from overvoltage conditions.

The robustness of the III-nitride p-i-n diodes 102, 104 against high transient current caused by an ESD event can be assumed to be quite high in the forward direction, but not in the reverse direction. As such, connecting the III-nitride p-i-n diodes 102, 104 in an antiparallel arrangement allows the ESD protection device 100 to withstand high transient current in both directions i.e. forward (positive) and reverse (negative). Also, the high mobility of carriers in III-nitride semiconductors such as GaN allows realization of a device with low serial resistance and low clamping voltage in response to an ESD event. The intrinsic zone of the III-nitride p-i-n diodes 102, 104 yield relatively low capacitance in the low current region. This allows for use in high frequency signal applications.

In one embodiment, the antiparallel arrangement of the III-nitride p-i-n diodes 102, 104 is configured to provide voltage clamping between 5V and 3.5V under forward bias of either diode 102, 104 for transient current in both forward and reverse directions. For example, the first and second III-nitride p-i-n diodes 102, 104 can each be configured to forward bias between 2.5V and 3.5V. Such low trigger (forward bias) voltages can be realized by using III-nitride semiconductors such as GaN, AlN, InN, and their alloys which have a wide bandgap compared to silicon (1.11 eV at room temperature) e.g. 1.9 eV for InN, 3.4 eV for GaN, and 6.2 eV for AlN at room temperature. Such wide bandgap semiconductor materials as compared to silicon result in a relatively high forward bias voltage for the III-nitride p-i-n diodes 102, 104 and relatively low leakage current below the forward bias voltage. For example, the III-nitride p-i-n diodes 102, 104 can each have a leakage current of less than 100 nA below the forward bias voltage.

FIG. 2 illustrates a sectional view of an embodiment of the III-nitride based ESD protection device 100. The antiparallel connected III-nitride p-i-n diodes 102, 104 of the protection device 100 are disposed on a semiconductor substrate 200 such as a silicon substrate in the case of a GaN-based III-nitride material system. A lower intrinsic III-nitride layer 201 can be provided for electrically isolating the antiparallel connected diodes 102, 104. The first III-nitride p-i-n diode 102 of the ESD protection device 100 comprises an intrinsic III-nitride zone 202 interposed between an n-type III-nitride zone 204 and a p-type III-nitride zone 206. The second III-nitride p-i-n diode 104 of the ESD protection device 100 similarly comprises an intrinsic III-nitride zone 208 interposed between an n-type III-nitride zone 210 and a p-type III-nitride zone 212. The n-type III-nitride zone 204 of the first p-i-n diode 102 is electrically connected to the p-type III-nitride zone 212 of the second p-i-n diode 104, and the p-type III-nitride zone 206 of the first p-i-n diode 102 is electrically connected to the n-type III-nitride zone 210 of the second p-i-n diode 104 to connect the p-i-n diodes 102, 104 in an antiparallel arrangement as schematically shown in FIGS. 1 and 2.

In one embodiment, the first III-nitride p-i-n diode 102 is a GaN p-i-n diode and the intrinsic III-nitride zone 202 of the first p-i-n diode 102 comprises an intrinsic GaN zone, the n-type III-nitride zone 204 of the first p-i-n diode 102 comprises an n-type GaN zone and the p-type III-nitride zone 206 of the first p-i-n diode 102 comprises a p-type GaN zone. The second III-nitride p-i-n diode 104 is also a GaN p-i-n diode according to this embodiment, and the intrinsic III-nitride zone 208 of the second p-i-n diode 104 comprises an intrinsic GaN zone, the n-type III-nitride zone 210 of the second p-i-n diode 104 comprises an n-type GaN zone and the p-type III-nitride zone 212 of the second p-i-n diode 104 comprises a second p-type GaN zone. Other III-nitride semiconductors such as AlN, InN, and their alloys can be used to form the different zones 202-212 of the p-i-n diodes 102, 104. A single metallization layer 214 can be provided for connecting the n-type III-nitride zone 204 of the first p-i-n diode 102 to the p-type III-nitride zone 212 of the second p-i-n diode 104 and for connecting the p-type III-nitride zone 206 of the first p-i-n diode 102 to the n-type III-nitride zone 210 of the second p-i-n diode 104 in the antiparallel arrangement.

Figure 3:
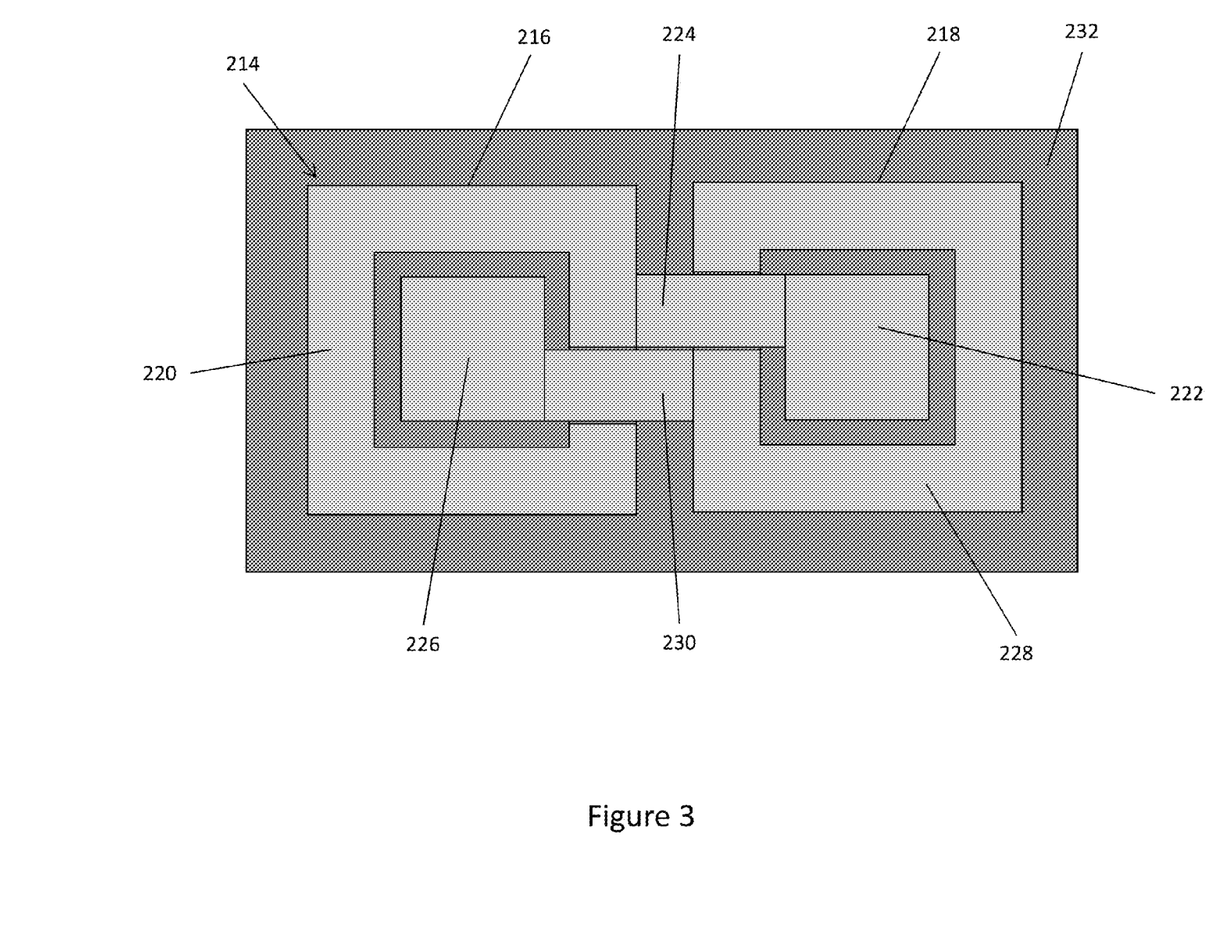
FIG. 3 illustrates a top-down plan view of the III-nitride based ESD protection device of FIG. 1.

FIG. 3 illustrates a top-down plan view of the III-nitride based ESD protection device 100 shown in FIG. 2 with the single metallization layer 214. The single metallization layer 214 comprises a first section 216 that connects the n-type III-nitride zone 204 of the first p-i-n diode 102 to the p-type III-nitride zone 212 of the second p-i-n diode 104, and a second section 218 separated from the first section 216 that connects the p-type III-nitride zone 206 of the first p-i-n diode 102 to the n-type III-nitride zone 210 of the second p-i-n diode 104. The first section 216 of the single metallization layer 214 can include a first contact 220 that surrounds the periphery of the n-type III-nitride zone 204 of the first p-i-n diode 102, a second contact 222 on the p-type III-nitride zone 212 of the second p-i-n diode 102 and a bridging part 224 that connects the first and second contacts 220, 222 of the first section 216. The second section 218 of the single metallization layer 214 similarly can include a first contact 226 on the p-type III-nitride zone 206 of the first p-i-n diode 102, a second contact 228 that surrounds the periphery of the n-type III-nitride zone 210 of the second p-i-n diode 104 and a bridging part 230 that connects the first and second contacts 226, 228 of the second section 218. A structured passivation layer 232 such as SiN, SiO2, Sc2O3, MgO, etc. provides the necessary isolation for enabling the antiparallel diode connection shown in FIGS. 1 and 2.

FIG. 4, which includes FIGS. 4A through 4F, illustrates respective sectional views of the III-nitride based ESD protection device 100 of FIG. 2 at different stages of manufacturing the ESD protection device 100. The method includes forming the first III-nitride p-i-n diode 102 on a semiconductor substrate 200, forming a second III-nitride p-i-n diode 104 on the same semiconductor substrate 200 and connecting the III-nitride p-i-n diodes 102, 104 in an antiparallel arrangement. The antiparallel arrangement of the III-nitride p-i-n diodes 102, 104 provides voltage clamping at 5V or less under forward bias of either p-i-n diode for transient current in both forward and reverse directions as previously described herein.

Figure 4A:
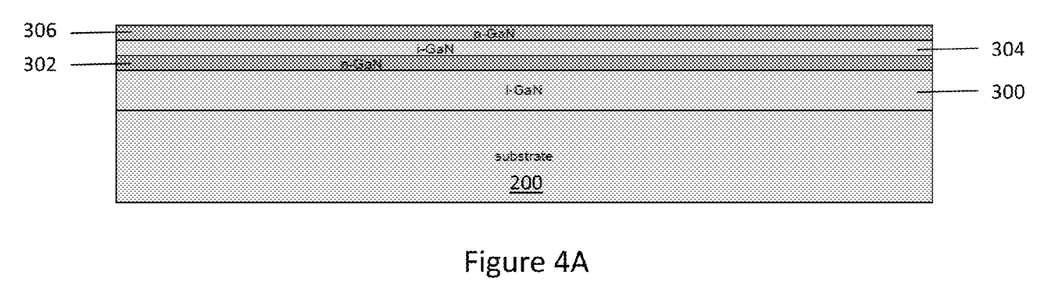
FIGS. 4A through 4F, illustrates sectional views of a III-nitride based ESD protection device at different stages of manufacturing according to an embodiment.

FIG. 4A shows the structure after a first (lower) intrinsic III-nitride layer 300 is formed on the semiconductor substrate 200, an n-type III-nitride layer 302 is formed on the first intrinsic III-nitride layer 300, a second (upper) intrinsic III-nitride layer 304 is formed on the n-type III-nitride layer 302, and a p-type III-nitride layer 306 is formed on the second intrinsic III-nitride layer 304. After the p-i-n diodes 102, 104 are formed, the lower intrinsic III-nitride layer 300 provides electrical isolation between the antiparallel connected diodes. The n-type III-nitride layer 302 provides lateral current distribution. The upper intrinsic III-nitride layer 304 reduces the capacitance of the ESD protection device 100. The p-type III-nitride layer 306 provides current injection in to the ESD protection device 100. The p-type and n-type III-nitride layers 302, 306 can be heavily doped e.g. up to $10^{18}$ cm$^{-3}$ to ensure good (low) ohmic contact.

In one embodiment, the first intrinsic III-nitride layer 300 is an intrinsic GaN layer, the n-type III-nitride layer 302 is an n-type GaN layer, the second intrinsic III-nitride layer 304 is an intrinsic GaN layer, and the p-type III-nitride layer 306 is a p-type GaN layer. In one embodiment, the lower intrinsic GaN layer 300 is at least 2 µm thick, the n-type GaN layer 302 is at least 3 µm thick, the upper intrinsic GaN layer 304 is at least 2 µm thick, and the p-type GaN layer 306 is at least 1 µm thick. The upper intrinsic III-nitride layer 304 can be made relatively thick (e.g. at least 2 µm thick for GaN) in order to enable low capacitance of the device. The term 'intrinsic' as used herein in the context of III-nitride p-i-n diodes means that the intermediary semiconductor zone between the p-type and n-type semiconductor zones of each p-i-n diode can be a pure semiconductor without any significant dopant species present or can even be lightly doped so long as the lower intrinsic III-nitride layer 300 provides adequate electrical isolation between the antiparallel connected diodes.

The layers 300-306 shown in FIG. 4A can be formed from other III-nitride semiconductors such as AlN, InN, and their alloys as previously described herein. In general, any standard III-nitride processing such as epitaxial layer deposition, lateral overgrowth of epitaxial layers, etc., can be used to form the different III-nitride layers 300-306 shown in FIG. 4A.

Figure 4B:
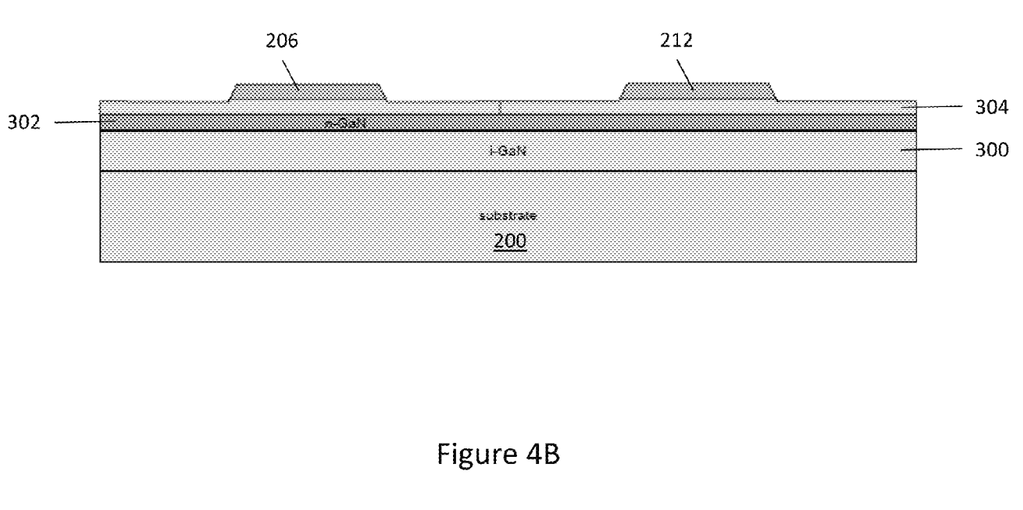

FIG. 4B shows the structure after unmasked parts of the p-type III-nitride layer 306 are removed to form the p-type III-nitride zones 206, 212 of the p-i-n diodes 102, 104. Any standard masking and removal processes can be used such as photolithography and etching, respectively.

Figure 4C:
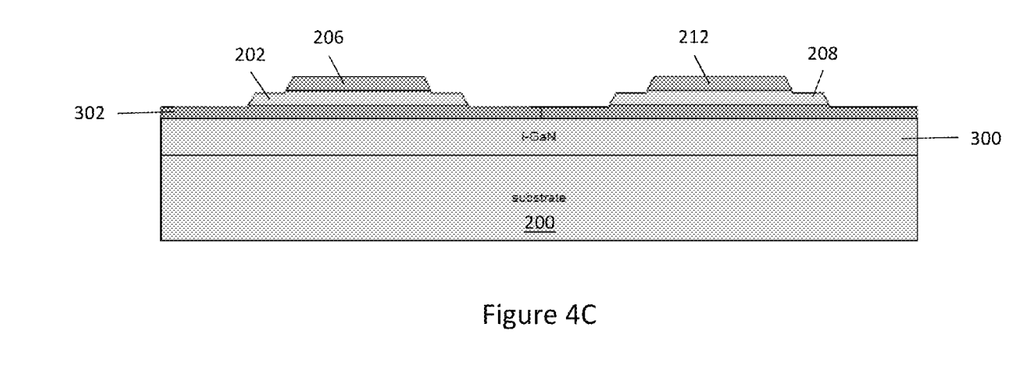

FIG. 4C shows the structure after unmasked parts of the upper intrinsic III-nitride layer 304 are removed to form the intrinsic III-nitride zones 202, 208 of the p-i-n diodes 102, 104. Any standard masking and removal processes can be used such as photolithography and etching, respectively.

Figure 4D:
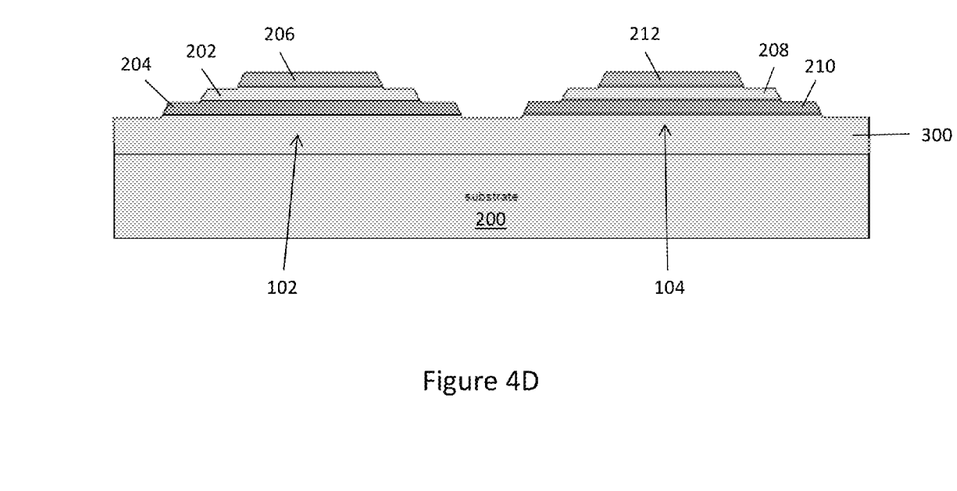

FIG. 4D shows the structure after unmasked parts of the n-type III-nitride layer 302 are removed to form the n-type III-nitride zones 204, 210 of the p-i-n diodes 102, 104. Any standard masking and removal processes can be used such as photolithography and etching, respectively.

After etching of the p-type III-nitride layer 306, the upper intrinsic III-nitride layer 304 and the n-type III-nitride layer 302, the III-nitride p-i-n diodes 102, 104 are formed. The first III-nitride p-i-n diode comprises a first intrinsic III-nitride zone interposed between a first n-type III-nitride zone and a first p-type III-nitride zone. The second III-nitride p-i-n diode comprises a second intrinsic III-nitride zone interposed between a second n-type III-nitride zone and a second p-type III-nitride zone.

Figure 4E:
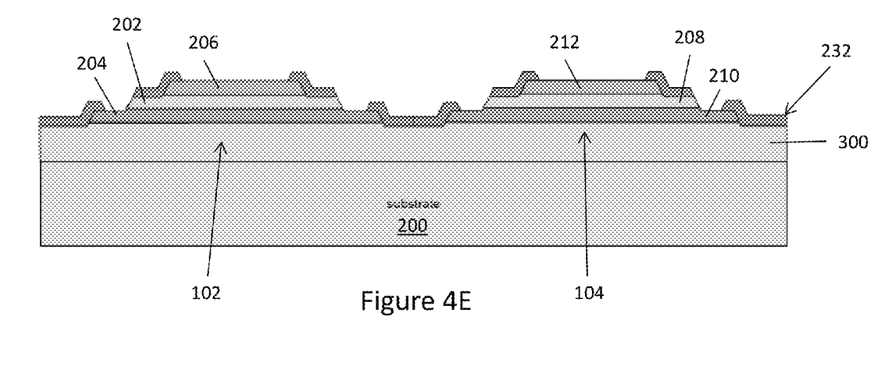

FIG. 4E shows the structure after the structured passivation layer 232 shown in FIGS. 2 and 3 is formed on parts of the p-i-n diodes 102, 104 to ensure only the sections of the p-i-n diodes 102, 104 to be contacted by the subsequently formed metallization remain uncovered. Any standard passivation process can be used such as plasma enhanced chemical vapor deposition or plasma enhanced molecular beam epitaxy.

Figure 4F:
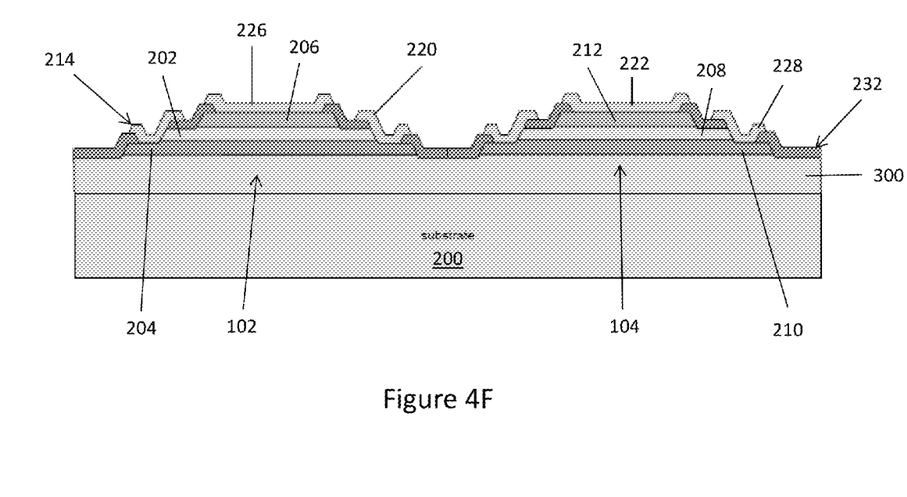

FIG. 4F shows the structure after the single metallization layer 214 shown in FIGS. 2 and 3 is formed to connect the III-nitride p-i-n diodes 102, 104 in an antiparallel arrangement as previously described herein, e.g. by any standard metal deposition process such as e-beam evaporation, sputtering, thermal evaporation, etc.

Figure 5:
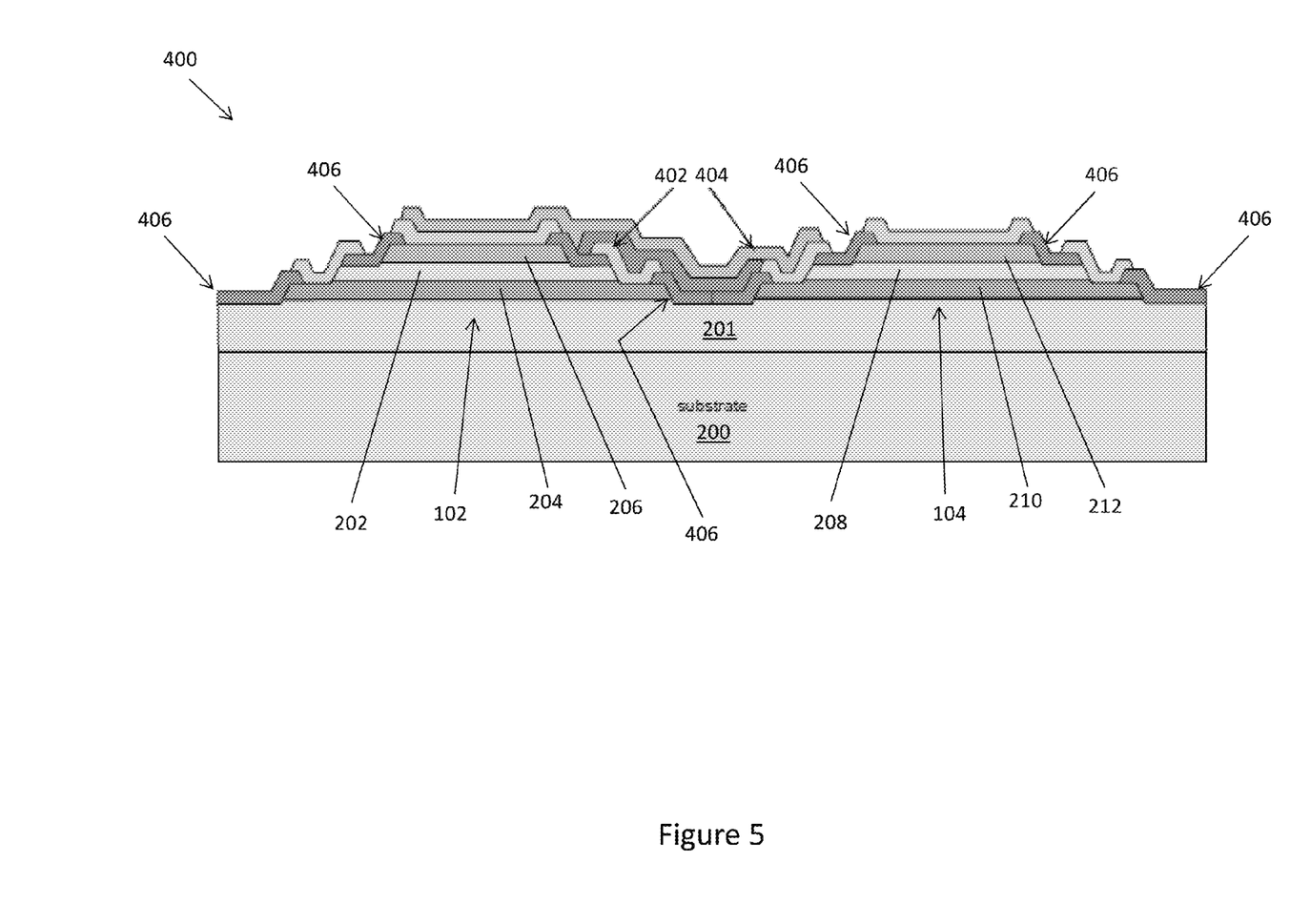
FIG. 5 illustrates a sectional view of another embodiment of a III-nitride based ESD protection device.

FIG. 5 illustrates a sectional view of another embodiment of a III-nitride based ESD protection device 400. The embodiment shown in FIG. 5 is similar to the one shown in FIGS. 2 and 3, however, at least two different metallization layers 402, 404 are used for connecting the n-type III-nitride zone 204 of the first p-i-n diode 102 to the p-type III-nitride zone 212 of the second p-i-n diode 104 and for connecting the p-type III-nitride zone 206 of the first p-i-n diode 102 to the n-type III-nitride zone 210 of the second p-i-n diode 104.

Figure 6:
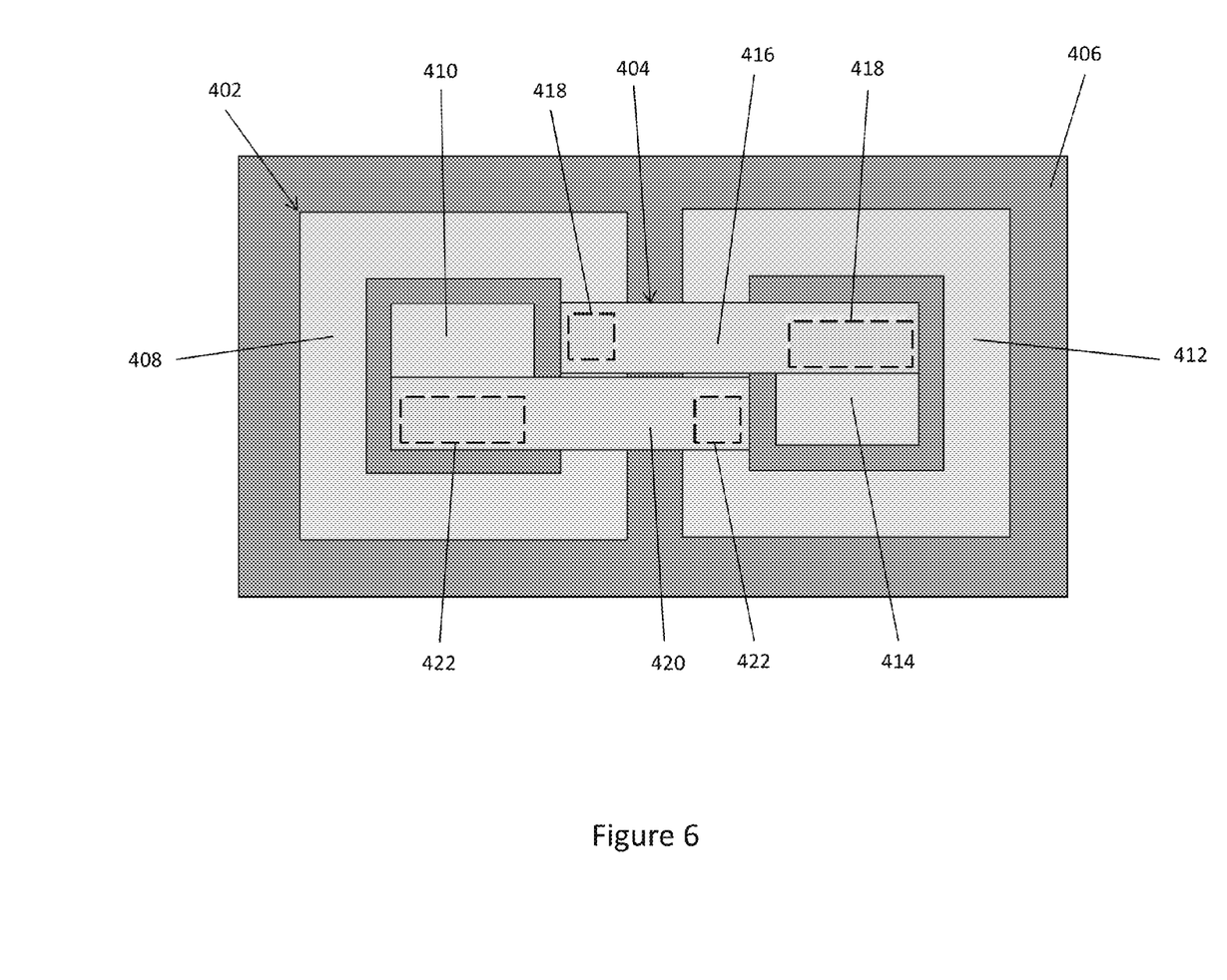
FIG. 6 illustrates a top-down plan view of the III-nitride based ESD protection device of FIG. 5.

FIG. 6 illustrates a top-down plan view of the III-nitride based ESD protection device 400 shown in FIG. 5 with two different metallization layers 402, 404 for connecting the III-nitride p-i-n diodes 102, 104 in the antiparallel arrangement shown in FIG. 1. The metallization layers 402, 404 are spaced apart and insulated from one another e.g. by one or more passivation layers 406 such as SiN, SiO2, Sc2O3, MgO, etc.

The first (lower) metallization layer 402 includes a first section 408 surrounding the periphery of the n-type III-nitride zone 204 of the first p-i-n diode 102, a second section 410 contacting the p-type III-nitride zone 206 of the first p-i-n diode 102, a third section 412 surrounding the periphery of the n-type III-nitride zone 210 of the second p-i-n diode 104, and a fourth section 414 contacting the p-type III-nitride zone 212 of the second p-i-n diode 104. The sections 408-414 of the first metallization layer 402 are separated from one another by the one or more passivation layers 406 to ensure sufficient electrical isolation.

The second (upper) metallization layer 404 includes a first section 416 connecting the first section 408 of the first metallization layer 402 to the fourth section 414 of the first metallization layer 402 by first conductive vias 418, and a second section 420 connecting the second section 410 of the first metallization layer 402 to the third section 412 of the first metallization layer 402 by second conductive vias 422. The conductive vias 418, 422 extend between the first and second metallization layers 402, 404 through the intermediary passivation layer(s) 406 and therefore are shown as dashed boxes in FIG. 6. The first and second sections 416, 420 of the second metallization layer 404 are separated from one another and from the first metallization layer 402 by the one or more passivation layers 406 to ensure sufficient electrical isolation, except where connected by the conductive vias 418, 422. Any standard metal deposition process such as e-beam evaporation, sputtering, thermal evaporation, etc. can be used to form the different metallization layers 402, 404.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An ESD (electrostatic discharge) protection device, comprising:
   a first III-nitride p-i-n diode; and
   a second III-nitride p-i-n diode connected to the first III-nitride p-i-n diode in an antiparallel arrangement configured to provide voltage clamping at 5V or less under forward bias of either the first or second III-nitride p-i-n diode for transient current in both forward and reverse directions.

2. The ESD protection device of claim 1, wherein the antiparallel arrangement of the first and second III-nitride p-i-n diodes is configured to provide voltage clamping between 5V and 3.5V under forward bias of either the first or second III-nitride p-i-n diode for transient current in both forward and reverse directions.

3. The ESD protection device of claim 1, wherein the first and second III-nitride p-i-n diodes are each configured to forward bias between 2.5V and 3.5V.

4. The ESD protection device of claim 1, wherein the first and second III-nitride p-i-n diodes each have a leakage current of less than 100 nA at voltages less than forward bias.

5. The ESD protection device of claim 1, wherein:
   the first III-nitride p-i-n diode comprises a first intrinsic III-nitride zone interposed between a first n-type III-nitride zone and a first p-type III-nitride zone;
   the second III-nitride p-i-n diode comprises a second intrinsic III-nitride zone interposed between a second n-type III-nitride zone and a second p-type III-nitride zone;
   the first n-type III-nitride zone is electrically connected to the second p-type III-nitride zone; and
   the first p-type III-nitride zone is electrically connected to the second n-type III-nitride zone.

6. The ESD protection device of claim 5, wherein:
   the first intrinsic III-nitride zone comprises a first intrinsic GaN zone;
   the first n-type III-nitride zone comprises a first n-type GaN zone;
   the first p-type III-nitride zone comprises a first p-type GaN zone;
   the second intrinsic III-nitride zone comprises a second intrinsic GaN zone;
   the second n-type III-nitride zone comprises a second n-type GaN zone; and
   the second p-type III-nitride zone comprises a second p-type GaN zone.

7. The ESD protection device of claim 1, wherein the first n-type III-nitride zone is electrically connected to the second p-type III-nitride zone and the first p-type III-nitride zone is electrically connected to the second n-type III-nitride zone by a single metallization layer.

8. The ESD protection device of claim 7, wherein the single metallization layer comprises a first section that connects the first n-type III-nitride zone to the second p-type III-nitride zone and a second section separated from the first section that connects the first p-type III-nitride zone to the second n-type III-nitride zone.

9. The ESD protection device of claim 1, wherein the first n-type III-nitride zone is electrically connected to the second p-type III-nitride zone and the first p-type III-nitride zone is electrically connected to the second n-type III-nitride zone by at least two different metallization layers.

10. The ESD protection device of claim 9, wherein:
    a first one of the at least two different metallization layers comprises a first section contacting the first n-type III-nitride zone, a second section contacting the first p-type III-nitride zone, a third section contacting the second n-type III-nitride zone, and a fourth section contacting the second p-type III-nitride zone, the sections of the first metallization layer being separated from one another; and
    a second one of the at least two different metallization layers comprises a first section connecting the first section of the first metallization layer to the fourth section of the first metallization layer, and a second section connecting the second section of the first metallization layer to the third section of the first metallization layer, the first and second sections of the second metallization layer being separated from one another and from the first metallization layer.

11. The ESD protection device of claim 1, wherein the first and second III-nitride p-i-n diodes are GaN p-i-n diodes disposed on a silicon substrate.

12. A method of manufacturing an ESD (electrostatic discharge) protection device, the method comprising:
    forming a first III-nitride p-i-n diode on a semiconductor substrate;
    forming a second III-nitride p-i-n diode on the semiconductor substrate; and
    connecting the second III-nitride p-i-n diode to the first III-nitride p-i-n diode in an antiparallel arrangement so as to provide voltage clamping at 5V or less under forward bias of either the first or second III-nitride p-i-n diode for transient current in both forward and reverse directions.

13. The method of claim 12, wherein the first II-nitride p-i-n diode comprises a first GaN p-i-n diode, the second III-nitride p-i-n diode comprises a second GaN p-i-n diode, and the semiconductor substrate comprises a silicon substrate.

14. The method of claim 12, wherein forming the first and second III-nitride p-i-n diodes on the semiconductor substrate comprises:
- forming a first intrinsic III-nitride layer on the semiconductor substrate;
- forming an n-type III-nitride layer on the first intrinsic III-nitride layer;
- forming a second intrinsic III-nitride layer on the n-type III-nitride layer;
- forming a p-type III-nitride layer on the second intrinsic III-nitride layer; and
- etching the p-type III-nitride layer, the second intrinsic III-nitride layer and the n-type III-nitride layer to form the first and second III-nitride p-i-n diodes, the first III-nitride p-i-n diode comprising a first intrinsic III-nitride zone interposed between a first n-type III-nitride zone and a first p-type III-nitride zone, and the second III-nitride p-i-n diode comprising a second intrinsic III-nitride zone interposed between a second n-type III-nitride zone and a second p-type III-nitride zone.

15. The method of claim 14, wherein the first intrinsic III-nitride layer comprises a first intrinsic GaN layer, the n-type III-nitride layer comprises an n-type GaN layer, the second intrinsic III-nitride layer comprises a second intrinsic GaN layer, and the p-type III-nitride layer comprises a p-type GaN layer.

16. The method of claim 14, wherein connecting the second III-nitride p-i-n diode to the first III-nitride p-i-n diode in an antiparallel arrangement comprises:
- electrically connecting the first n-type III-nitride zone to the second p-type III-nitride zone; and
- electrically connecting the first p-type III-nitride zone to the second n-type III-nitride zone.

17. The method of claim 16, wherein electrically connecting the first n-type III-nitride zone to the second p-type III-nitride zone and electrically connecting the first p-type III-nitride zone to the second n-type III-nitride zone comprises:
- forming a single metallization layer comprising a first section that connects the first n-type III-nitride zone to the second p-type III-nitride zone and a second section separated from the first section that connects the first p-type III-nitride zone to the second n-type III-nitride zone.

18. The method of claim 16, wherein electrically connecting the first n-type III-nitride zone to the second p-type III-nitride zone and electrically connecting the first p-type III-nitride zone to the second n-type III-nitride zone comprises:
- forming a first metallization layer comprising a first section contacting the first n-type III-nitride zone, a second section contacting the first p-type III-nitride zone, a third section contacting the second n-type III-nitride zone, and a fourth section contacting the second p-type III-nitride zone, the sections of the first metallization layer being separated from one another, and
- forming a second metallization layer comprising a first section connecting the first section of the first metallization layer to the fourth section of the first metallization layer, and a second section connecting the second section of the first metallization layer to the third section of the first metallization layer, the first and second sections of the second metallization layer being separated from one another and from the first metallization layer.

19. The method of claim 14, wherein the first intrinsic GaN layer is at least 2 μm thick, the n-type GaN layer is at least 3 μm thick, the second intrinsic GaN layer is at least 2 μm thick, and the p-type GaN layer is at least 1 μm thick.

20. An ESD (electrostatic discharge) protection device, comprising:
- a first III-nitride p-i-n diode; and
- a second III-nitride p-i-n diode connected to the first III-nitride p-i-n diode in an antiparallel arrangement, each point of connection between the first and second III-nitride p-i-n diodes forming a terminal of the ESD protection device across which voltages are limited to 5V or less when either the first or second III-nitride p-i-n diode is under forward bias.

* * * * *

UNITED STATES PATENT AND TRADEMARK OFFICE
CERTIFICATE OF CORRECTION

PATENT NO. : 9,548,293 B2  
APPLICATION NO. : 14/180980  
DATED : January 17, 2017  
INVENTOR(S) : H. Werthmann Page 1 of 1

It is certified that error appears in the above-identified patent and that said Letters Patent is hereby corrected as shown below:

On the Title Page

Other publications (Line 3), please change "Corporaton" to -- Corporation --

In the Claims

Column 8, Line 63 (Claim 13, Line 1), please change "II-nitride" to -- III-nitride --

Column 10, Line 15 (Claim 18, Line 12), please change "another," to -- another; --

Signed and Sealed this  
Fifth Day of September, 2017

Joseph Matal  
*Performing the Functions and Duties of the*  
*Under Secretary of Commerce for Intellectual Property and*  
*Director of the United States Patent and Trademark Office*